United States Patent
Robin et al.

(10) Patent No.: US 12,557,440 B2
(45) Date of Patent: Feb. 17, 2026

(54) FLEXIBLE OPTOELECTRONIC DEVICE AND PROCESS FOR MANUFACTURING SAME

(71) Applicant: Aledia, Echirolles (FR)

(72) Inventors: Ivan-Christophe Robin, Grenoble (FR); Frédéric Mayer, Voiron (FR)

(73) Assignee: Aledia, Echirolles (FR)

( * ) Notice: Subject to any disclaimer, the term of this patent is extended or adjusted under 35 U.S.C. 154(b) by 406 days.

(21) Appl. No.: 18/016,853

(22) PCT Filed: Jul. 16, 2021

(86) PCT No.: PCT/EP2021/069931
§ 371 (c)(1),
(2) Date: Jan. 18, 2023

(87) PCT Pub. No.: WO2022/017972
PCT Pub. Date: Jan. 27, 2022

(65) Prior Publication Data
US 2023/0299233 A1 Sep. 21, 2023

(30) Foreign Application Priority Data
Jul. 22, 2020 (FR) .................................. 2007682

(51) Int. Cl.
*H01L 25/075* (2006.01)
*H10H 20/00* (2025.01)
(Continued)

(52) U.S. Cl.
CPC ....... *H10H 20/819* (2025.01); *H01L 25/0753* (2013.01); *H10H 20/00* (2025.01); *H10H 20/8506* (2025.01); *H10H 20/857* (2025.01)

(58) Field of Classification Search
CPC .. H10H 20/819; H10H 20/00; H10H 20/8506; H10H 20/857; H10H 20/018;
(Continued)

(56) References Cited

U.S. PATENT DOCUMENTS

| 7,671,364 B2 * | 3/2010 | Lee | H10D 30/6758 |
| | | | 257/E29.273 |
| 8,766,269 B2 * | 7/2014 | Yamazaki | H10K 50/8423 |
| | | | 257/729 |

(Continued)

FOREIGN PATENT DOCUMENTS

| TW | 202019255 A | 5/2020 |
| WO | WO 2020/128341 A1 | 6/2020 |

OTHER PUBLICATIONS

International Search Report and Written Opinion for International Application No. PCT/EP2021/069931, mailed Oct. 4, 2021.
(Continued)

*Primary Examiner* — Vu A Vu
(74) *Attorney, Agent, or Firm* — Wolf, Greenfield & Sacks, P.C.

(57) ABSTRACT

An optoelectronic device including an optoelectronic circuit including light-emitting diodes, thin-film transistors, and a stack of electrically-insulating layers, said stack being located between the light-emitting diodes, and the transistors stack further including conductive elements, between and through the insulating layers, the conductive elements connecting at least some of the transistors to the light-emitting diodes The device further includes a support having a surface, the support being flexible and/or the surface being curved and non-planar, the optoelectronic circuit being connected to the surface on the side of the thin-film transistors.

21 Claims, 7 Drawing Sheets

(51) Int. Cl.
*H10H 20/819* (2025.01)
*H10H 20/85* (2025.01)
*H10H 20/857* (2025.01)

(58) Field of Classification Search
CPC ...... H10H 20/833; H10H 29/10; H10H 29/14; H01L 25/0753; H01L 25/167; Y02E 10/549
USPC .......................................................... 257/79
See application file for complete search history.

(56) References Cited

U.S. PATENT DOCUMENTS

| | | | | |
|---|---|---|---|---|
| 9,406,898 | B2* | 8/2016 | Yamazaki | H10K 59/131 |
| 9,966,553 | B2* | 5/2018 | Choi | H10K 50/824 |
| 10,043,989 | B2* | 8/2018 | Momma | H10K 50/844 |
| 10,720,558 | B2* | 7/2020 | Moon | H01L 25/0753 |
| 10,816,841 | B2* | 10/2020 | Eguchi | G09F 9/301 |
| 10,816,849 | B2* | 10/2020 | Lee | G02F 1/133606 |
| 11,538,968 | B2* | 12/2022 | Song | H10H 20/854 |
| 11,581,383 | B2* | 2/2023 | Wang | G09G 3/32 |
| 11,710,760 | B2* | 7/2023 | Kusunoki | H10H 20/8514 |
| | | | | 257/43 |
| 11,776,970 | B2* | 10/2023 | Shin | H10D 86/60 |
| | | | | 257/79 |
| 11,908,850 | B2* | 2/2024 | Yamazaki | H01L 25/50 |
| 11,961,871 | B2* | 4/2024 | Kusunoki | H01L 21/7806 |
| 12,033,987 | B2* | 7/2024 | Watanabe | H01L 25/0753 |
| 2018/0053790 | A1 | 2/2018 | Kwon et al. | |
| 2019/0371779 | A1 | 12/2019 | Yeon et al. | |
| 2020/0152113 | A1 | 5/2020 | Hugon et al. | |
| 2020/0161520 | A1 | 5/2020 | Hugon et al. | |
| 2021/0005794 | A1* | 1/2021 | Sakong | H10H 29/142 |

OTHER PUBLICATIONS

Ionescu et al., Studies of Large Area LED Structures on Flexible Substrates. 2018 IEEE 24th International Symposium for Design and Technology in Electronic Packaging (SIITME) Oct. 25, 2018; 265-71.

Keränen et al., Roll-to-roll printed and assembled large area LED lighting element. The International Journal of Advanced Manufacturing Technology. Oct. 2015;81(1):529-36.

Van den Ende et al., Large area flexible lighting foils using distributed bare LED dies on polyester substrates. Microelectronics Reliability. Dec. 1, 2013;53(12):1907-15.

Office Action for Taiwanese Application No. 110126572, dated Aug. 20, 2025.

* cited by examiner

FLEXIBLE OPTOELECTRONIC DEVICE AND PROCESS FOR MANUFACTURING SAME

This Application is a national stage filing under 35 U.S.C. § 371 of International Patent Application Serial No. PCT/EP2021/069931, filed Jul. 16, 2021, which claims priority to French patent application FR20/07682. The contents of these applications are incorporated herein by reference in their entirety.

TECHNICAL BACKGROUND

The present disclosure generally concerns optoelectronic devices and, more specifically, devices comprising light-emitting diodes.

PRIOR ART

The phrase "optoelectronic devices comprising light-emitting diodes" designates devices capable of converting an electric signal into an electromagnetic radiation, and particularly devices dedicated to emitting an electromagnetic radiation, particularly light.

It is known to form a flexible optoelectronic device, for example, a flexible display screen, comprising organic light-emitting diodes by the deposition of organic layers on a flexible substrate.

It may be desirable to form a flexible optoelectronic device comprising light-emitting diodes made of inorganic semiconductor materials. A method of manufacturing such a flexible optoelectronic device may comprise the manufacturing of light-emitting diodes in the form of discrete components, the attaching of each component to an integrated circuit, for example comprising transistors for controlling the light-emitting diodes, the thinning of the integrated circuit to obtain a flexible structure and the attaching of this structure to a flexible substrate.

Such a method has the disadvantage of requiring many transfer steps, which are complex and expensive.

SUMMARY

An embodiment overcomes all or part of the disadvantages of known flexible optoelectronic devices and of their manufacturing methods.

An object of an embodiment is for the light-emitting diodes of the optoelectronic device to form a monolithic structure all along the optoelectronic device manufacturing method.

An object of an embodiment is for the optoelectronic device manufacturing method to comprise a reduced number of transfer steps.

One embodiment provides an optoelectronic device comprising:
- an optoelectronic circuit comprising light-emitting diodes; thin-film transistors, and a stack of electrically-insulating layers, said stack being located between the light-emitting diodes and the transistors, said stack further comprising electrically-conductive elements, between and through said electrically-insulating layers, said electrically-conductive elements connecting at least some of the transistors to the light-emitting diodes; and
- a support having a surface, the support being flexible and/or the surface being curved and non-planar, the optoelectronic circuit being connected to the surface on the side of the thin-film transistors.

The structure of the optoelectronic circuit associating light-emitting diodes and thin-film transistors, with an interconnection area interposed therebetween, in the absence of a semiconductor substrate, and the fact for the optoelectronic circuit to be connected to the support, on the transistor side, advantageously enables to form the optoelectronic circuit with a small thickness. This enables to ease the connection of the optoelectronic circuit to the support. The use of a non-planar support may thus be easily envisaged. Further, the support may also have a small thickness, which advantageously enables to form an optoelectronic device of small thickness, and thus to form a flexible optoelectronic device. The small thickness of the optoelectronic circuit enables to obtain a flexible optoelectronic circuit. This advantageously enables not to have rigid points when the optoelectronic circuit is attached to a flexible or curved-surface support. This further advantageously enables to decrease the mechanical stress at the level of the connections between the optoelectronic circuit and the support.

According to an embodiment, the support comprises electrically-conductive tracks, each electrically-conductive track being connected to one of the transistors.

The integration of transistors to the optoelectronic circuit enables to form control functions directly at the level of the optoelectronic circuit. This enables to simplify the design of the support.

According to an embodiment, the device further comprises a circuit for controlling the optoelectronic circuit coupled to the electrically-conductive tracks.

According to an embodiment, the total thickness of the optoelectronic circuit is in the range from 0.1 µm to 500 µm.

According to an embodiment, the light-emitting diodes comprise wire-shaped, conical, or frustoconical semiconductor elements.

According to an embodiment, the thickness of the support is in the range 5 µm to 1,000 µm.

According to an embodiment, the support is at least partly made of polyethylene naphthalate, of polyethylene terephthalate, of polyimide, of cellulose triacetate, of cycloolefin copolymer, of polyetheretherketone, or of a mixture of at least two of these compounds.

This advantageously enables to form a flexible support.

According to an embodiment, the transistors are distributed in at least one thin-film transistor stage.

According to an embodiment, each stage comprises an insulating layer forming the gate insulator of all the transistors of this stage.

According to an embodiment, for at least one of the transistors, the source and drain regions and the gate of the transistor are located in a same insulating layer According to an embodiment, wherein the control circuit rests on the support.

According to an embodiment, the device comprises a single copy of the optoelectronic circuit.

According to an embodiment, the device comprises a plurality of copies of the optoelectronic circuit attached to the support and spaced apart from one another. According to an embodiment, the copies of the electronic circuits are arranged in rows and in columns, the electrically-conductive tracks extending along the rows and the columns, each electrically-conductive track being connected to transistors of a plurality of optoelectronic circuits. The fact of using a plurality of separate optoelectronic circuits attached to the support enables to form a display screen with a flexible active matrix or having a curve shape.

An embodiment also provides a method of manufacturing an optoelectronic device such as previously described, comprising the forming of an optoelectronic circuit comprising the successive steps of:

a) forming light-emitting diodes;

b) forming, on the light-emitting diodes, a stack of electrically-insulating layers, said stack further comprising conductive elements between and through said insulating layers; and c) forming, on said stack, thin-film transistors, said stack being located between the light-emitting diodes and the transistors, said conductive elements connecting at least some of the transistors to the light-emitting diodes, the assembly comprising the light-emitting diodes, the stack, and the thin-film transistors forming an optoelectronic circuit.

The fact of forming on light-emitting diodes an interconnection area and then thin-film transistors enables to do away with the presence of a semiconductor substrate in the structure of the optoelectronic circuit. An optoelectronic circuit having a small thickness can thus be obtained.

According to an embodiment, the method further comprises the following step, after step c):

d) attaching the optoelectronic circuit to a surface of a support, the support being flexible and/or the surface being curved and non-planar.

This advantageously enables to decrease constraints in terms of selection of the materials forming the support. In particular, this enables to easily form a support which is flexible and/or having a non-planar shape.

According to an embodiment, the optoelectronic circuit is formed in a plurality of copies forming one-piece structure, the method further comprising the following step, after step c):

e) separation of each copy of the optoelectronic circuit.

According to an embodiment, step a) comprises forming wire-shaped, conical, or frustoconical semiconductor elements.

According to an embodiment, step a) comprises the forming of electrically-conductive or semiconductor seed pads on a substrate and the growth of the semiconductor elements on the seed pads.

According to an embodiment, steps b) and c) are carried out at temperatures lower than 180° C.

This advantageously enables to decrease constraints in terms of selection of the materials forming the optoelectronic circuit. In particular, this enables to easily form an optoelectronic device which is flexible.

BRIEF DESCRIPTION OF THE DRAWINGS

The foregoing features and advantages, as well as others, will be described in detail in the following description of specific embodiments given by way of illustration and not limitation with reference to the accompanying drawings, in which.

DESCRIPTION OF THE EMBODIMENTS

Figure 1:
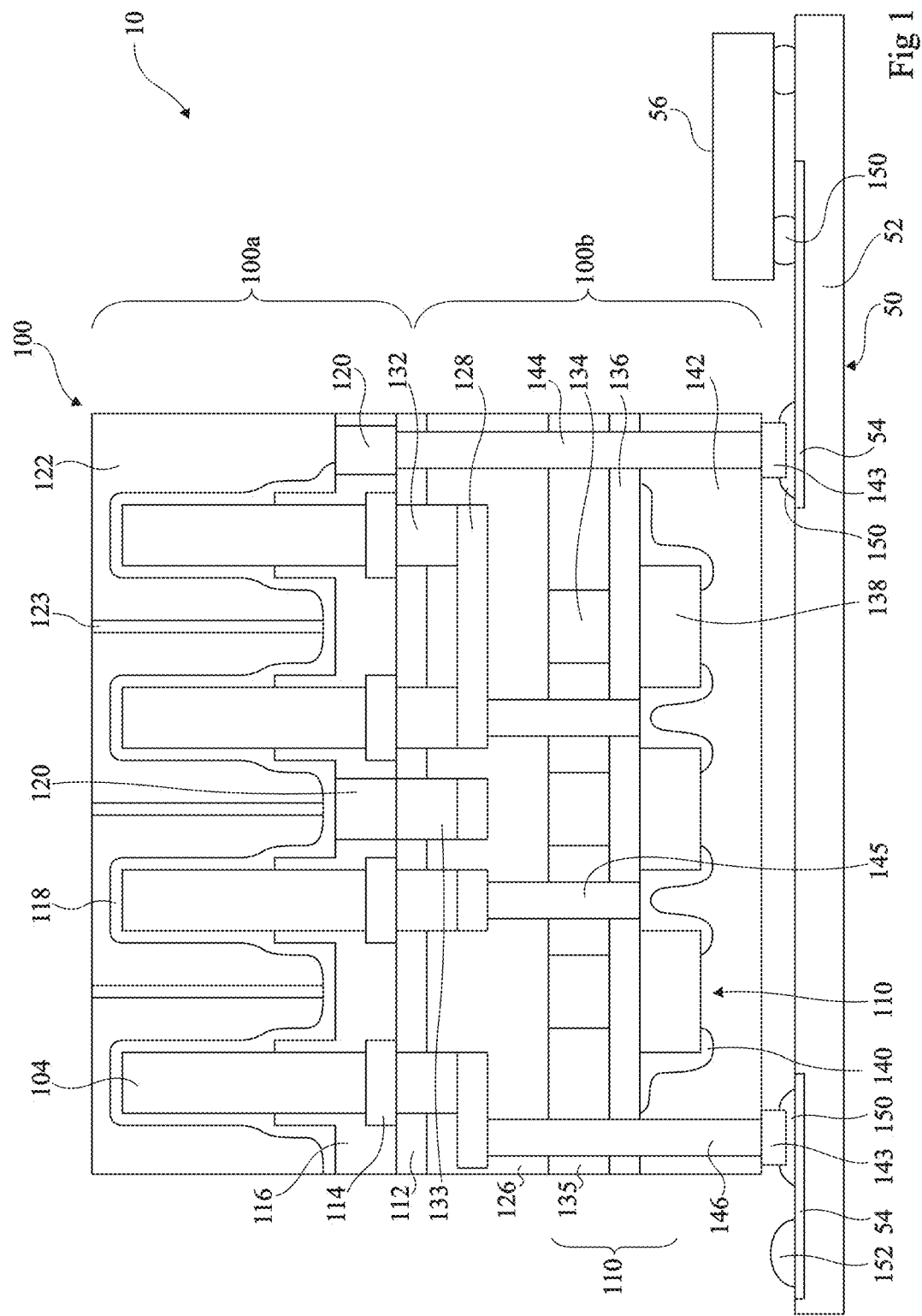
FIG. 1 is a partial simplified cross-section view of an embodiment of a flexible optoelectronic device.

Like features have been designated by like references in the various figures. In particular, the structural and/or functional features that are common among the various embodiments may have the same references and may dispose identical structural, dimensional and material properties.

For the sake of clarity, only the steps and elements that are useful for an understanding of the embodiments described herein have been illustrated and described in detail. In particular, electric connections between various conductive portions may be present, without being shown, in the cross-section planes of the drawings or in planes parallel to the cross-section planes of the drawings.

Unless specified otherwise, when reference is made to two elements connected together, this signifies a direct connection without any intermediate elements other than conductors, and when reference is made to two elements coupled together, this signifies that these two elements can be connected or they can be coupled via one or more other elements.

In the following disclosure, unless otherwise specified, when reference is made to absolute positional qualifiers, such as the terms "front", "back", "top", "bottom", "left", "right", etc., or to relative positional qualifiers, such as the terms "above", "below", "upper", "lower", etc., or to qualifiers of orientation, such as "horizontal", "vertical", etc., reference is made to the orientation shown in the figures. Unless specified otherwise, the expressions "around", "approximately", "substantially" and "in the order of" signify within 10%, and preferably within 5%. Further, it is here considered that the terms "insulating" and "conductive" respectively mean "electrically insulating" and "electrically conductive".

In the following description, embodiments are described for optoelectronic devices comprising three-dimensional light-emitting diodes, that is, for which each light-emitting diode comprises a wire-shaped, conical, or frustoconical semiconductor element, for example, a microwire or a nanowire. However, these embodiments may also be implemented for planar light-emitting diodes, that is, for light-emitting diodes formed from a stack of planar semiconductor layers.

The term "microwire" or "nanowire" designates a three-dimensional structure having an elongated shape along a preferred direction, having at least two dimensions, called minor dimensions, in the range from 5 nm to 5 µm, preferably from 50 nm to 2.5 µm, the third dimension, called major dimension or height, being at least equal to 1 time, preferably at least 5 times, and more preferably still at least 10 times, the largest minor dimension. In certain embodiments, the minor dimensions may be smaller than or equal to approximately 1 µm, preferably in the range from 100 nm to 1 µm, more preferably from 100 nm to 300 nm. In certain embodiments, the height of each microwire or nanowire may be greater than or equal to 500 nm, preferably in the range from 1 µm to 50 µm. The base of the wire for example has an oval, circular, or polygonal shape, particularly triangular, rectangular, square, or hexagonal.

FIG. 1 schematically shows an embodiment of an optoelectronic device 10, particularly a display screen.

According to an embodiment, optoelectronic device 10 comprises a flexible support 50 and a flexible optoelectronic circuit 100 attached to flexible support 50. Flexible support 50 comprises a flexible substrate 52 and conductive tracks 54 at the surface of substrate 52. Optoelectronic device 10 may comprise an integrated circuit or more than one integrated circuit attached to flexible support 50, a single integrated circuit 56 being shown in FIG. 1.

Optoelectronic circuit 100 comprises a first portion 100a comprising the optoelectronic components of optoelectronic circuit 100 and a second portion 100b comprising electronic circuits adapted to controlling the optoelectronic components.

First portion 100a comprises:
an insulating seed layer 112;
conductive or semiconductor seed pads 114, at least partially resting on layer 112, layer 112 being made of a material favoring the growth of pads 114;
light-emitting diodes 104, four light-emitting diodes being shown in FIG. 1. Each light-emitting diode 104 rests on a conductive pad 114, each pad 114 being in contact with one of the anode or the cathode of the associated light-emitting diode 114. Conductive pads 114 are made of a material favoring the growth of conductive elements of light-emitting diodes 104;
an insulating layer 116, covering insulating layer 112, a portion of each pad 114, and a lower portion of each light-emitting diode 104;
conductive pads 120 located between certain light-emitting diodes 104 in layer 116;
a conductive layer 118, transparent to the radiations emitted by light-emitting diodes 104, covering the upper portions of light-emitting diodes 104 and insulating layer 116. Conductive layer 118 is in contact with the other one of the anode or of the cathode of each light-emitting diode 104 and with conductive pads 120. Layer 118 thus forms an electrode common to all light-emitting diodes 104;
blocks 122 covering conductive layer 118 and each surrounding at least one light-emitting diode 104, four blocks 122 each covering a light-emitting diode being shown in FIG. 1; and
walls 123 separating blocks 122 from one another.

Each light-emitting diode 104 may be controlled by a voltage delivered between pad 114 connected to one of the anode or of the cathode of light-emitting diode 104 and electrode layer 118, connected to the other one of the anode or of the cathode of light-emitting diode 104.

The total thickness of first portion 100a is in the range from 50 nm to 30 µm. The total thickness of second portion 100b is in the range from 50 nm to 499.95 µm. The total thickness of optoelectronic circuit 10 is in the range from 0.1 µm to 500 µm. Due to its small thickness, optoelectronic circuit 10 has a flexible character.

Certain blocks 122 may be transparent to the radiations emitted by light-emitting diodes 104, for example, in the case of light-emitting diodes 104 emitting blue light. Blocks 122 may have a monolayer or multilayer structure. According to an embodiment, blocks 122 comprise at least one layer deposited by a conformal deposition method. According to an embodiment, blocks 122 comprise at least one first layer deposited by a conformal deposition method and in contact with conductive layer 118, and at least one second layer for filling the spaces between light-emitting diodes to obtain a substantially planar front surface. Each block 122, or at least one of the layers forming it when block 122 has a multilayer structure, may further comprise a photoluminescent material capable, when it is excited by the light emitted by the light-emitting diode(s) covered with the block, of emitting light at a wavelength different from the wavelength of the light emitted by the light-emitting diode(s). Walls 123 prevent the radiation of each light-emitting diode from reaching the neighboring blocks 122.

As a variant, seed layer 112 and/or seed pads 114 may not be present.

The second portion 110b of optoelectronic circuit 100 comprises:
a stack 126 of insulating layers, represented in FIG. 1 by a single block 126. Stack 126 is located in contact with the surface of layer 112 opposite to pads 114. Stack 126 further comprises conductive elements 128, for example, conductive tracks and conductive vias, located between and through the insulating layers of stack 126. Conductive elements 128 form an interconnection network. In particular, the conductive vias 132 of the interconnection network cross layer 112 to be connected to pads 114, and thus to be coupled to light-emitting diodes 104. Preferably, each pad 114 is in contact with a conductive via 132. Further, the conductive vias 133 of the interconnection network cross layer 112 to be connected to conductive pads 120. Thus, pads 120 are interconnected to deliver in a plurality of locations a same voltage to conductive layer 118;
transistors 110 located on the side of stack 126 opposite to light-emitting diodes 104, three transistors being shown in FIG. 1. Transistors 110 are thin film transistors (TFT). More specifically, each transistor 110 comprises:
a semiconductor or conductive block 134, forming the gate of transistor 110. The gate of each transistor 110 is connected, by a first surface, to the interconnection network by connections, not shown. Blocks 134 are separated from one another by insulating regions 135;
an insulating layer 136 covering a second surface, opposite to the first surface, of block 134, where insulating layer 136 may be common to all transistors 110; and
a semiconductor block 138 located opposite block 134, on the other side of insulating layer 136. Block 138 comprises the source and drain areas of transistor 110. The portion of insulating layer 136 located between block 134 and block 136 forms the gate insulator of transistor 110;
conductive tracks 140 partially extending on semiconductor blocks 138, as well as on insulating layer 136, to connect the source and drain areas of transistors 110 to one another. In the example of FIG. 1, conductive tracks 140 connect the three transistors 110 in series. However, other layouts are possible;
an insulating layer 142 covering conductive tracks 140, insulating layer 136, and semiconductor blocks 138;
conductive pads 143 on insulating layer 142, on the side of insulating layer 142 opposite to transistors 110;

conductive vias 144, 145, 146, a conductive via 144 being shown in FIG. 1, capable of crossing insulating layer 112, the insulating layers of stack 126, and insulating layers 135 and 136 to electrically connect a conductive pad 120 to a pad 143, vias 145 being shown as crossing insulating layers 126, 135, and 136 to electrically connect conductive tracks 140 to the interconnection network and a via 146 being shown in FIG. 1, capable of crossing insulating layer 112 and the insulating layers of stack 126, and insulating layers 135 and 136 to electrically connect a pad 143 to the interconnection network.

Optoelectronic circuit 100 and integrated circuit 56 are connected to the conductive tracks 54 of flexible support 50 by connection elements, for example, solder balls 150. Flexible support 50 may be connected to other elements, for example, a flexible cable, not shown, by connection elements 152, for example, solder balls. According to an embodiment, the optoelectronic device comprises a single copy of optoelectronic circuit 100. According to another embodiment, the optoelectronic device comprises a plurality of copies of optoelectronic circuit 100 attached to flexible support 50. Optoelectronic circuits 100 may be arranged in rows and in columns on flexible support 50. Conductive tracks 54 may extend on flexible support 50 along the rows and the columns. Each conductive track 54 may be connected to a plurality of optoelectronic circuits 100. Conductive tracks 54 are coupled to a control circuit, for example, integrated circuit 56, or an electronic circuit which does not rest on flexible support 50. According to an embodiment, each optoelectronic circuit 100 is connected to at least first and second conductive tracks 54, the first conductive track being used by the control circuit to select optoelectronic circuit 100 and the second conductive track being used by the control circuit to transmit data to optoelectronic circuit 100.

Substrate 52 may have a monolayer structure or correspond to a stack of at least two layers. Substrate 52 may correspond to a film made of PEN (polyethylene naphthalate), PET (polyethylene terephthalate), PI (polyimide), TAC (cellulose triacetate), COP (cycloolefin copolymer), or PEEK (polyetheretherketone). The thickness of substrate 52 may be in the range from 5 μm to 1,000 μm, preferably from 10 μm to 300 μm, more preferably from 75 μm to 250 μm, particularly in the order of 125 μm. According to an embodiment, substrate 52 may be a flexible film having a flexible behavior, that is, substrate 52 may, under the action of an external force, deform, and particularly bend, without breaking or tearing. Conductive tracks 54 may be metallic, for example, made of copper.

Each light-emitting diode 104 comprises two semiconductor elements, one of which is for example a three-dimensional element as previously described, for example, a wire, and an active layer interposed between the two semiconductor elements.

Seed pads 114, also called seed islands, are made of a material favoring the growth of the wires of light-emitting diodes 104. As an example, the material forming seed pads 114 may be a nitride, a carbide, or a boride of a transition metal from column IV, V, or VI of the periodic table of elements, or a combination of these compounds. As an example, seed pads 114 may be made of aluminum nitride (AlN), of boron (B), of boron nitride (BN), of titanium (Ti), of titanium nitride (TiN), of tantalum (Ta), of tantalum nitride (TaN), of hafnium (Hf), of hafnium nitride (HfN), of niobium (Nb), of niobium nitride (NbN), of zirconium (Zr), of zirconium borate (ZrB$_2$), of zirconium nitride (ZrN), of silicon carbide (SiC), of tantalum carbonitride (TaCN), of magnesium nitride in Mg$_x$N$_y$ form, where x is approximately equal to 3 and y is approximately equal to 2, for example, magnesium nitride in Mg$_3$N$_2$ form or magnesium gallium nitride (MgGaN), of tungsten (W), of tungsten nitride (WN), or of a combination thereof.

The insulating materials may be selected from the group comprising silicon oxide (SiO$_2$), silicon oxynitride (SiON), silicon nitride (SiN), aluminum nitride (AlN), titanium oxide (TiO$_2$), aluminum oxide (Al$_2$O$_3$), electrically-insulating organic materials, for example, parylene or ALX resin, and mixtures of at least two of these compounds.

The semiconductor elements of light-emitting diodes 104 are at least partly formed based on at least one semiconductor material. The semiconductor material may be silicon, germanium, silicon carbide, a III-V compound, a II-VI compound, or a combination of these compounds.

The semiconductor elements may be at least partly made of semiconductor materials mainly comprising a III-V compound, for example, III-N compounds. Examples of group-III elements comprise gallium (Ga), indium (In), or aluminum (Al). Examples of III-N compounds are GaN, AN, InN, InGaN, AlGaN, or AlInGaN. Other group-V elements may also be used, for example, phosphorus or arsenic. Generally, the elements in the III-V compound may be combined with different molar fractions.

The semiconductor elements may be at least partly formed based on semiconductor materials mainly comprising a II-VI compound. Examples of group-II elements comprise group-IIA elements, particularly beryllium (Be) and magnesium (Mg), and group-IIB elements, particularly zinc (Zn) and cadmium (Cd). Examples of group-VI elements comprise group-VIA elements, particularly oxygen (O) and tellurium (Te). Examples of II-VI compounds are ZnO, ZnMgO, CdZnO, or CdZnMgO. Generally, the elements in the II-VI compound may be combined with different molar fractions.

The semiconductor elements may comprise a dopant. As an example, for III-V compounds, the dopant may be selected from the group comprising a P-type group-II dopant, for example, magnesium (Mg), zinc (Zn), cadmium (Cd), or mercury (Hg), a P-type group-IV dopant, for example, carbon (C), or an N-type group-IV dopant, for example, silicon (Si), germanium (Ge), selenium (Se), sulfur (S), terbium (Tb), or tin (Sn).

The active layer is the layer from which most of the radiation delivered by the light-emitting diode is emitted. As an example, the active layer may comprise confinement means, such as a single quantum well or multiple quantum wells. It is for example formed of an alternation of GaN and InGaN layers having respective thicknesses from 5 to 20 nm (for example, 8 nm) and from 1 to 10 nm (for example, 2.5 nm). The GaN layers may for example be N- or P-type doped.

FIGS. 2 to 10 are partial simplified cross-section views showing the structures obtained at successive steps of another embodiment of a method of manufacturing the optoelectronic device 10 of FIG. 1.

Figure 2:
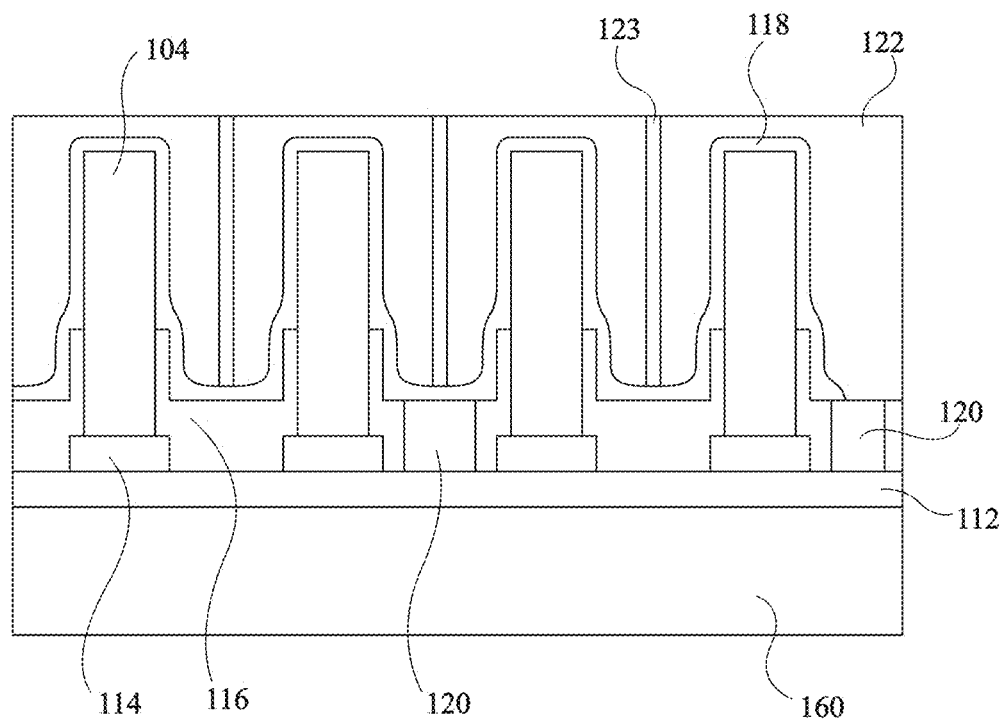
FIG. 2 is a partial simplified cross-section view of the structure obtained at a step of an embodiment of a method of manufacturing the optoelectronic device shown in FIG. 1.

FIG. 2 shows the structure obtained after the steps of:
  forming of seed layer 112 on a substrate 160, for example, a semiconductor substrate, for example, made of silicon;
  forming of seed pads 114 on seed layer 112 at the locations where light-emitting diodes 104 are desired to be formed;

forming of a first portion of insulating layer 116 partially covering pads 114 and leaving the locations of light-emitting diodes 104 exposed;

forming of light-emitting diodes 104 on pads 114 at the locations left exposed by the first portion of insulating layer 116;

forming of the second portion of insulating layer 116 on the lower portion of light-emitting diodes 104;

forming of pads 120 extending through layer 116 from layer 112;

forming of conductive layer 118 on light-emitting diodes 104 and on insulating layer 116; and forming of photoluminescent blocks 122 on conductive layer 118 and forming of walls 123.

Figure 3:
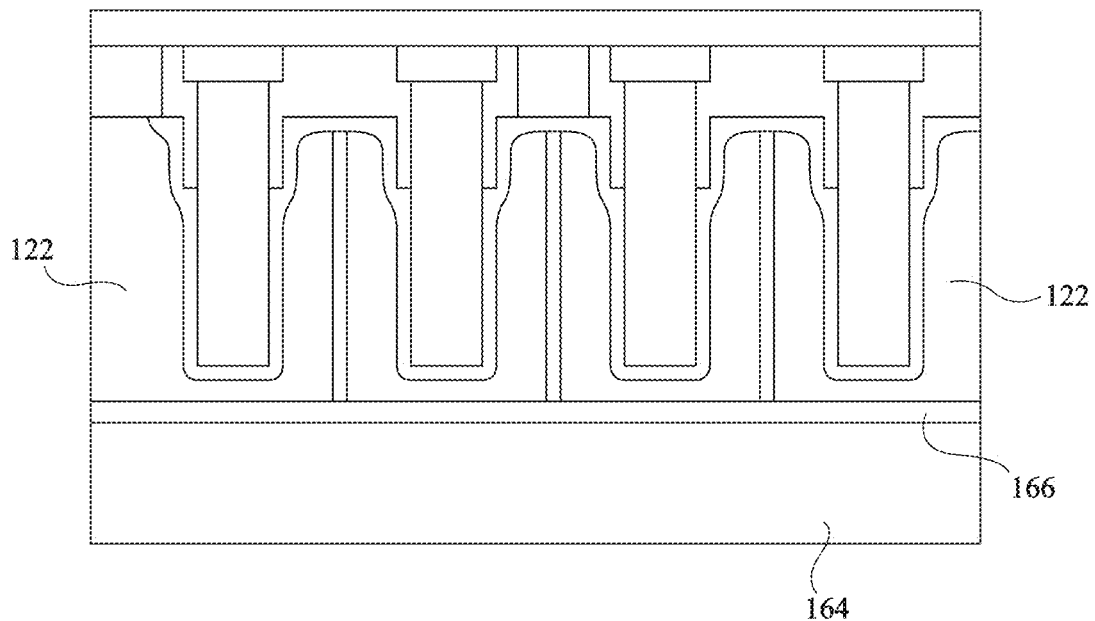
FIG. 3 illustrates another step of the manufacturing method.

FIG. 3 shows the structure obtained after the steps of:

forming of a handle 164, attached to blocks 122, for example, by a bonding layer 166, particularly a glue layer; and removal of substrate 160, for example by chemical-mechanical planarization (CMP).

As a variant, a step of removal of seed layer 112 and/or of seed pads 114 may further be provided.

Figure 4:
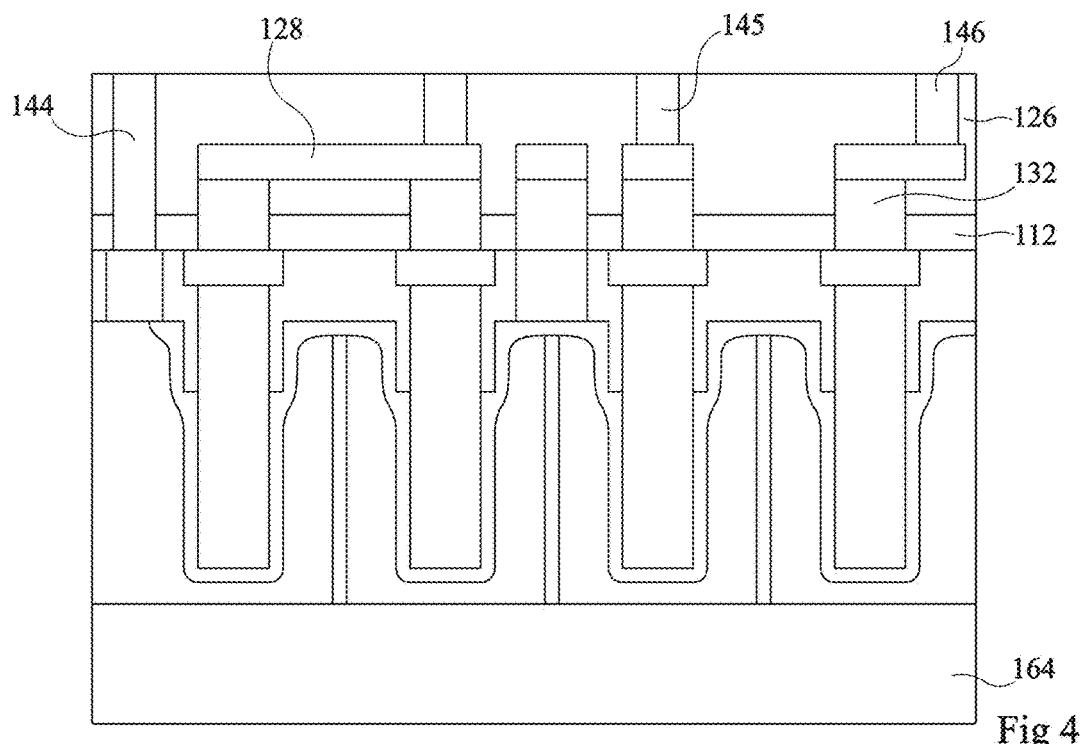
FIG. 4 illustrates another step of the manufacturing method.

FIG. 4 shows the structure obtained after the forming on insulating layer 112 of stack 126, particularly conductive elements 128, including the conductive vias 132 which cross insulating layer 112 and possibly a portion of vias 144, 145, 146.

Figure 5:
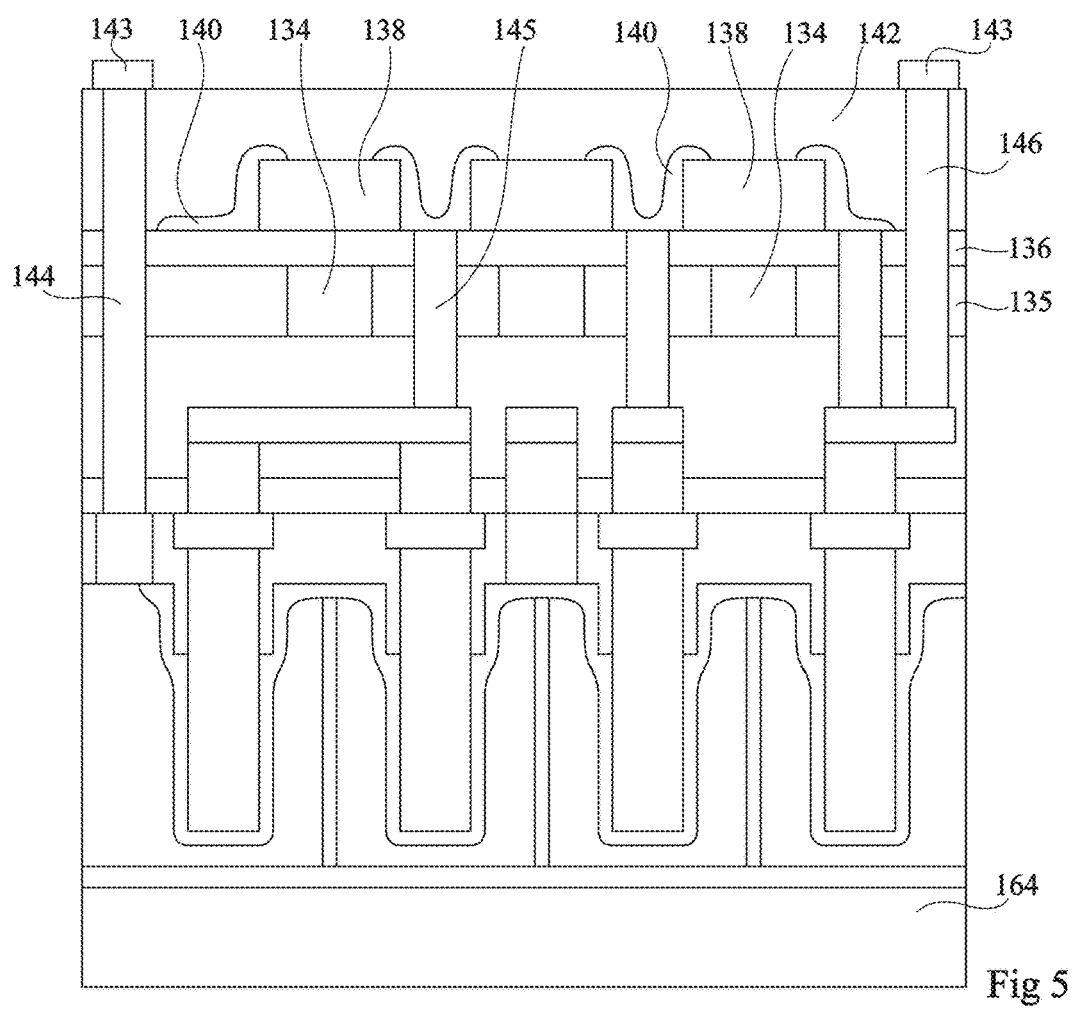
FIG. 5 illustrates another step of the manufacturing method.

FIG. 5 shows the structure obtained after the steps of:

forming of blocks 134, made of a semiconductor or conductive material, for example, of polysilicon, on stack 126, in contact with conductive elements 128, not shown in FIG. 5;

forming of insulating regions 135 between blocks 134. The thickness of regions 135 is substantially equal to the thickness of blocks 134 and enables to leave the surface of each block 134 opposite to stack 126 exposed;

forming of insulating layer 136 on the exposed surfaces of blocks 134 and on regions 135;

forming of a portion of conductive vias 144, 145, 146, through insulating layers 136, 135;

forming of semiconductor blocks 138 opposite blocks 134 on layer 136;

forming of conductive tracks 140 in contact with the drain and source areas of the different blocks 138;

forming of insulating layer 142 on blocks 138, conductive tracks 140, and layer 136;

forming of another portion of vias 144, 146 through insulating layer 142; and forming of pads 143 on insulating layer 142.

As a variant, vias 144 and/or 146 may be formed at once after the forming of insulating layer 142.

The steps of manufacturing transistors 110 are steps of manufacturing of thin-film transistors, for example, IGZO transistors. More precisely, these steps are preferably carried out at a maximum temperature smaller than 180° C. These steps are, in the present embodiment, performed in the reverse order with respect to the usual order of the steps of thin-film transistor manufacturing, that is, the gate is formed before the source and drain regions.

According to an embodiment, a plurality of optoelectronic circuits are simultaneously formed according to the steps previously described in relation with FIGS. 2 to 5. In particular, the light-emitting diodes 104 of a plurality of optoelectronic circuits may be simultaneously formed on the same substrate 160, which may correspond to a silicon wafer. The method then comprises a step of separation of the optoelectronic circuits. This separation step may be formed by etching, for example after the steps previously described in relation with FIG. 5 while the optoelectronic circuits rest on handle 164.

Figure 6:
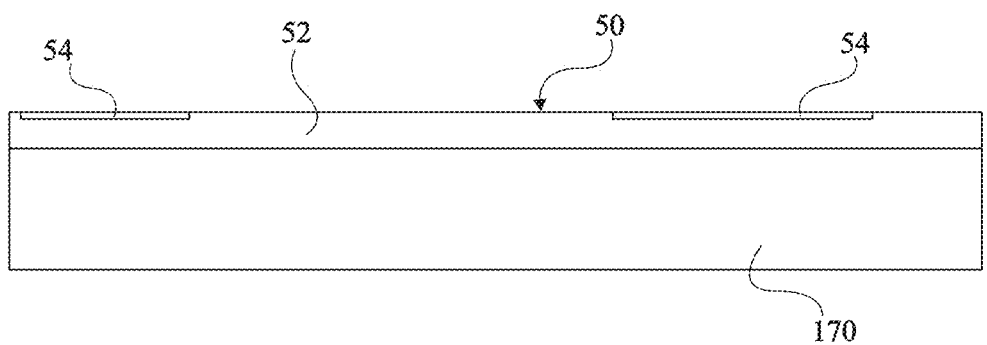
FIG. 6 illustrates another step of the manufacturing method.

FIG. 6 illustrates the step of forming of flexible support 50 comprising the forming of flexible substrate 52 on a handle 170, for example, by lamination of a film on handle 170, and the forming of conductive tracks 54 at the surface of flexible substrate 52 to obtain flexible support 50.

Figure 7:
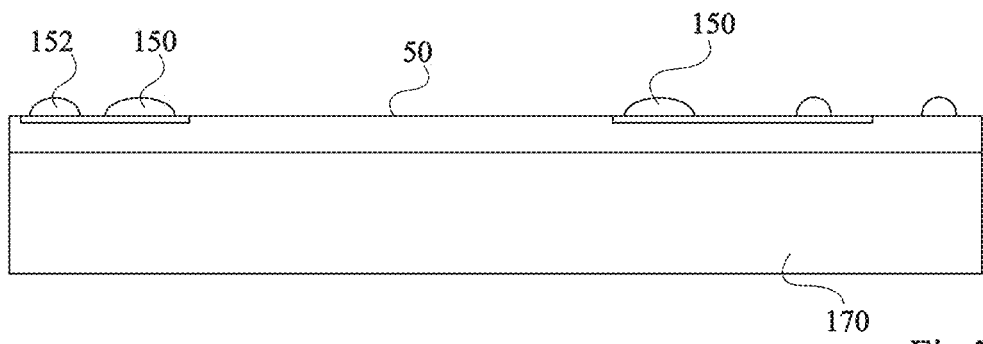
FIG. 7 illustrates another step of the manufacturing method.

FIG. 7 shows the structure obtained after the step of forming of connection element 150, 152 on flexible support 50.

Figure 8:
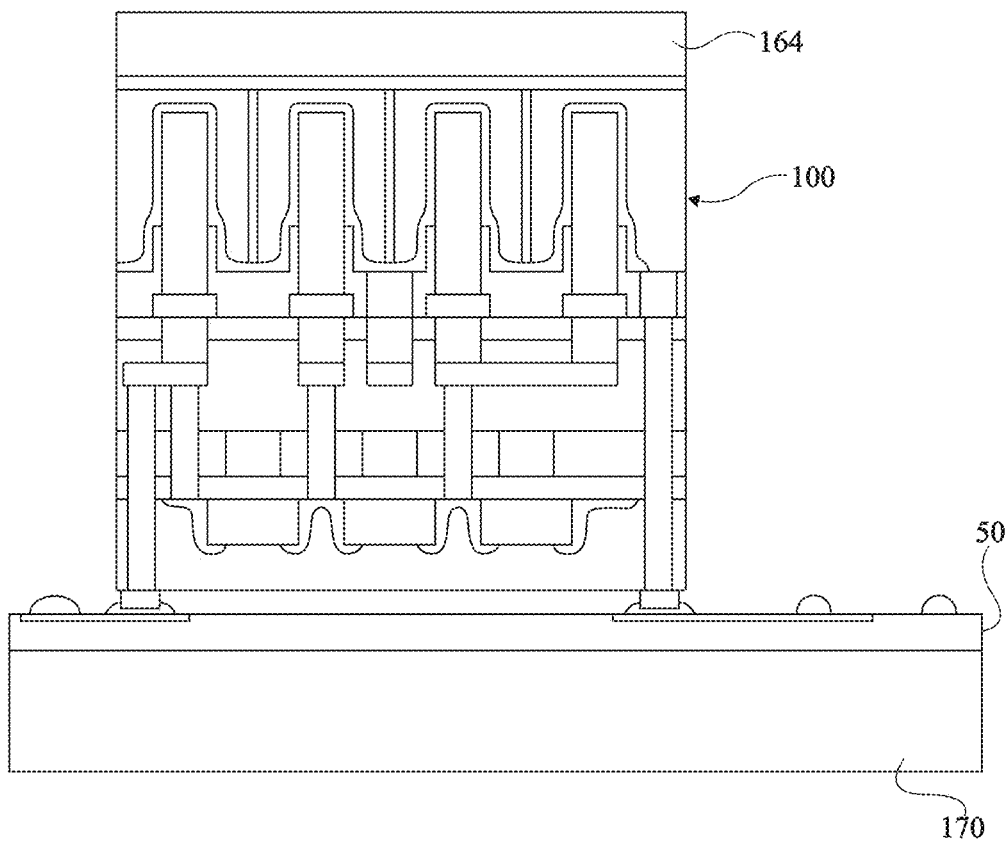
FIG. 8 illustrates another step of the manufacturing method.

FIG. 8 shows the structure obtained after the attaching, on flexible support 50, of the optoelectronic circuit 100 shown in FIG. 5, the support being still attached to handle 170 and circuit 100 being still attached to handle 164.

Figure 9:
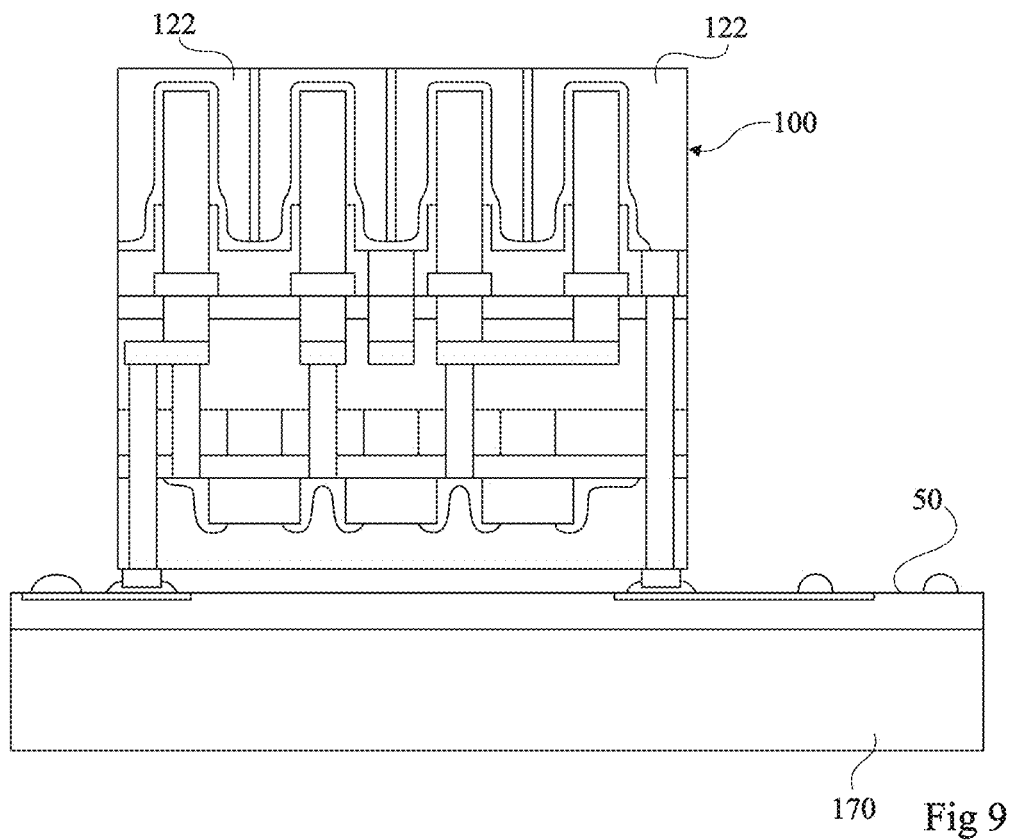
FIG. 9 illustrates another step of the manufacturing method.

FIG. 9 shows the structure obtained after the removal of handle 164 to expose the upper surface of blocks 122.

Figure 10:
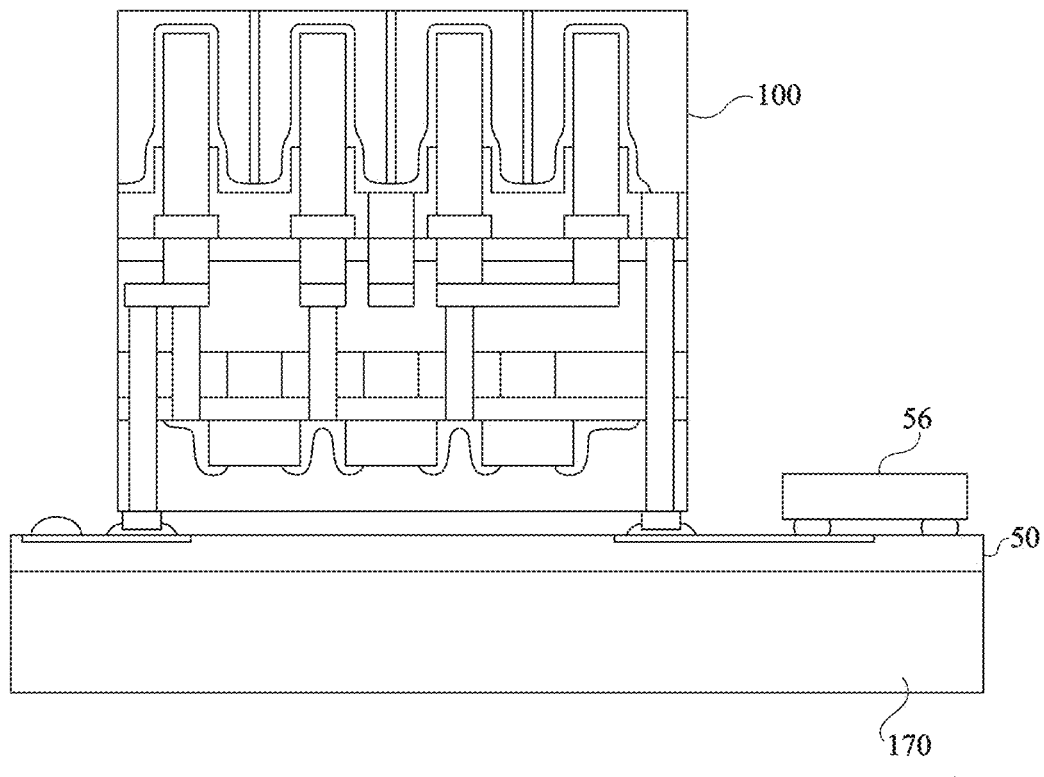
FIG. 10 illustrates another step of the manufacturing method.

FIG. 10 shows the structure obtained after the attaching of the other elements to flexible support 50, particularly integrated circuit 56.

The method carries on with the removal of handle 170 to obtain the optoelectronic device 10 shown in FIG. 1.

Figure 11:
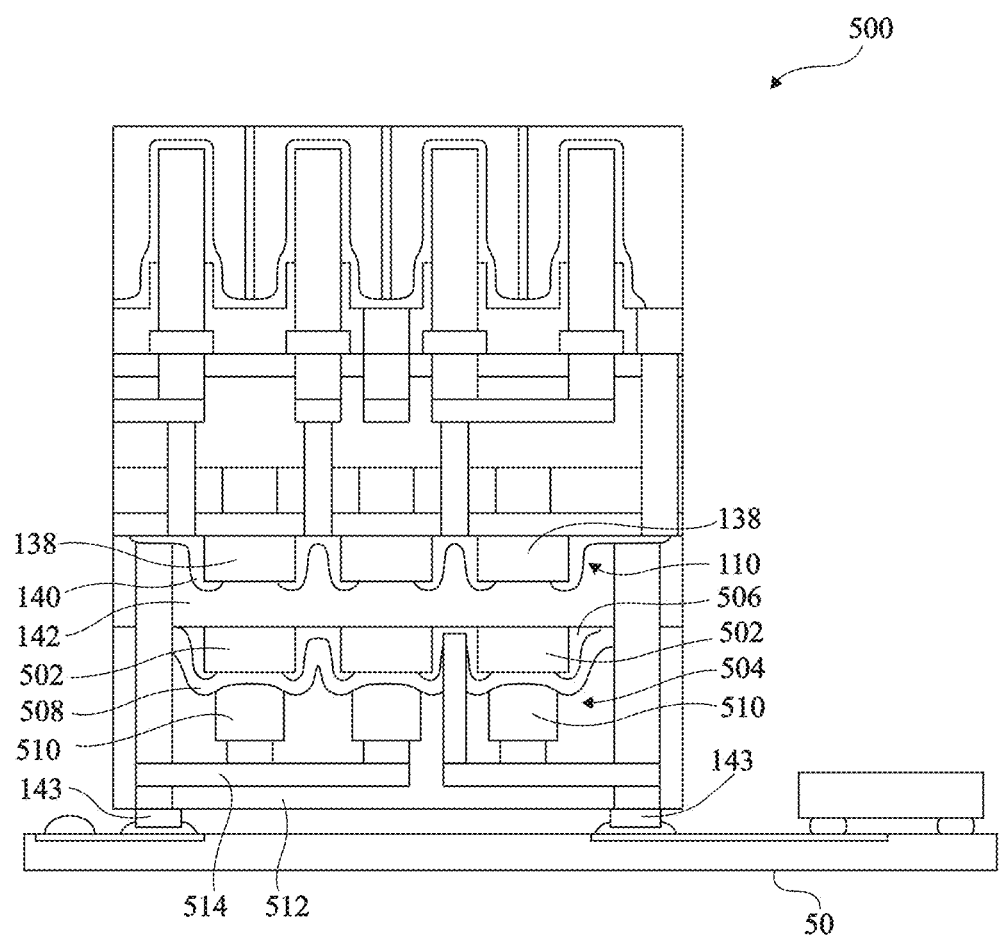
FIG. 11 is a partial simplified cross-section view of another embodiment of a flexible optoelectronic device.

FIG. 11 schematically shows another embodiment of an optoelectronic device 500. Device 500 comprises all the elements of device 10 and further comprises an additional stage of thin-film transistors 504, three transistors being shown, located on the stage comprising transistors 110. Device 500 thus comprises:

semiconductor blocks 502 located on insulating layer 142. Blocks 502 comprise the source and drain areas of thin film transistors 504. Blocks 502 are similar to semiconductor blocks 138;

conductive tracks 506, similar to conductive tracks 140, electrically connecting together the source and drain areas of blocks 502. In the embodiment of FIG. 11, the three transistors are series-connected as an example;

an insulating layer 508 covering layer 142, conductive tracks 506, and blocks 502;

conductive blocks 510 formed on layer 508, opposite conductive blocks 502. Blocks 510 form the gates of transistors 504, and the portions of layer 508 located between blocks 510 and 502 form the gate insulators; and a stack 512 of insulating layers, shown in FIG. 11 by a single block 512, covering transistors 504. Stack 512 further comprises conductive elements 514, for example, conductive tracks and conductive vias, located between and through the insulating layers of stack 512. Conductive elements 514 form an interconnection network. Conductive elements 514 for example connect some of blocks 510 and some of conductive layers 506 to conductive tracks 140. Conductive elements 514 may thus partially cross insulating layer 512, insulating layer 508, and insulating layer 142 to reach conductive tracks 140.

Device 500 thus comprises two stages of thin film transistors. As a variant, optoelectronic device 500 may comprise more than two stages of thin-film transistors. The presence of a plurality of transistor stages has the advantage of increasing the density of transistors.

As a variation, some of conductive elements 514 may connect conductive tracks 506 to conductive tracks 140.

Although, in the embodiment of FIG. 11, each transistor 504 is located opposite a transistor 110, the transistors of the different stages may be offset from one another and the transistor density may be different according to the considered stage.

Figure 12:
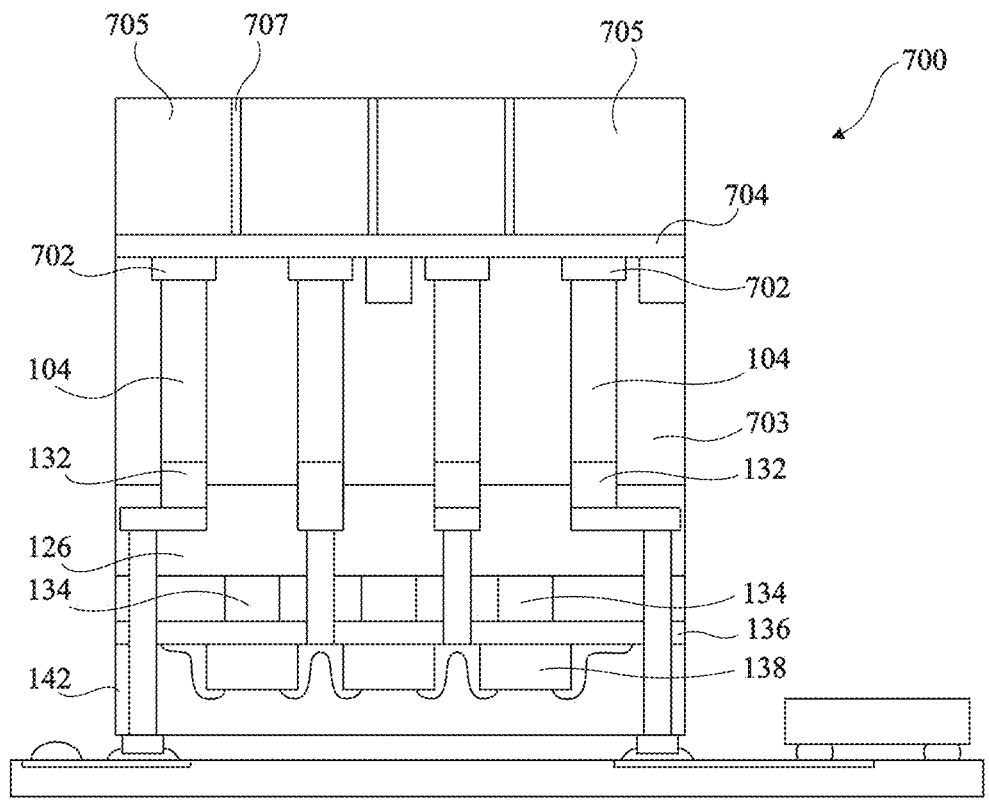
FIG. 12 is a partially simplifier cross-section view of an embodiment of a flexible optoelectronic device.

FIG. 12 schematically shows another embodiment of an optoelectronic device 700. Optoelectronic device 700 comprises light-emitting diodes 104, resting on seed pads 702 and surrounded with an insulating layer 703. Seed pads 702 are similar to the previously-described seed pads 114. Each pad 702 is at least partially transparent to the radiation emitted by the light-emitting diode formed on this pad 702.

Seed pads 702 rest on a conductive layer 704. Layer 704 is preferably at least partially transparent to the radiations emitted by light-emitting diodes 704. Pads 702 are in contact with layer 704 to form an electric connection. Layer 704 thus forms an electrode common to all the light-emitting diodes 104.

Layer 704 is covered with a plurality of photoluminescent blocks 705, photoluminescent blocks 705 being similar to the previously-described photoluminescent blocks 122. More particularly, each block 705 is located opposite a light-emitting diode 104. Further, blocks 705 are separated from one another by walls 707 similar to the previously-described walls 123.

The rest of device 700 is identical to device 10, with the difference that each light-emitting diode 104 is in contact, by the side opposite to seed pad 702, with a conductive element 132 of the interconnection network.

Thus, each light-emitting diode 104 may be controlled by a voltage applied between one of the anode or of the cathode, via a pad 702, and the other one of the anode or of the cathode, via a conductive element 132.

The previously-described embodiments implement a flexible support 50. According to another embodiment, the surface of support 50 having optoelectronic circuit 100 resting thereon is a non-planar curved surface, support 50 being flexible or rigid. According to an embodiment, optoelectronic circuit 100 is directly attached to the non-planar curved surface of support 50. According to another embodiment, optoelectronic circuit 100 is attached to support 50 in an initial configuration of support 50 where the surface having optoelectronic circuit 100 attached thereon is planar and support 50 is deformed, according to a plastic deformation when support 50 is rigid, to bring the surface having optoelectronic circuit 100 attached thereon into a final configuration where this surface is curved and non-planar.

Figure 13:
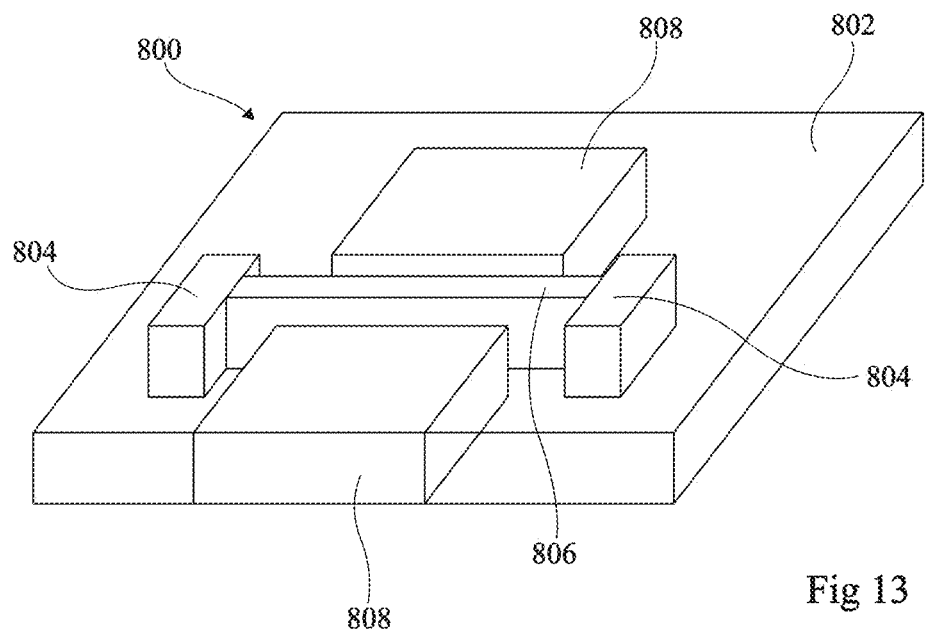
FIG. 13 is a partial simplified perspective view of an embodiment of a thin-film transistor.

FIG. 13 schematically shows another embodiment of a thin-film transistor capable of being used with the previously-described optoelectronic devices 10, 500, 700. Transistor 800 is called horizontal transistor. Horizontal transistor means a transistor having its different portions, for example, the source and drain regions, the gate, and the channel, at the same level, in a same layer, and, preferably, formed at the same time.

Thus, transistor 800 is formed in an insulating layer 802, for example, made of silicon oxide. Transistor 800 comprises, in layer 802:
- two semiconductor blocks 804, forming the drain and source areas;
- a semiconductor block 806 extending between blocks 804, and being in contact with blocks 804. Block 806 forms the channel of transistor 800; and
- blocks 808, made of a semiconductor or conductive material, located on either side of block 806 and forming the gate of transistor 800. Blocks 808 are separated from channel 806 by a portion of insulating layer 802.

Insulating layer 802, comprising transistors 800, may replace the layers, for example layers 135, 136, and 142, comprising transistors 110.

An advantage of the previously-described embodiments is that the manufacturing of the interconnection levels of stack 126 and of thin-film transistors 110 has a thermal budget compatible with light-emitting diodes 104, that is, the manufacturing of transistors 110 may be performed on a structure already comprising light-emitting diodes 104 without negatively impacting the performance of light-emitting diodes 104.

As previously described, a plurality of optoelectronic circuits are simultaneously formed in monolithic fashion on a same integrated circuit wafer.

More precisely, such an embodiment comprises the successive steps of:
a) simultaneous forming on the same substrate 160 of a plurality of copies of the first portion 100a of optoelectronic circuit 100, comprising light-emitting diodes 104, particularly by the simultaneous carrying out, in a plurality of copies on the same substrate 160, of the steps previously described in relation with FIG. 2;
b) attaching of handle 164 to the first portions 100a of optoelectronic circuit 100, and removal of substrate 160, for example, by CMP, as previously described in relation with FIG. 3;
c) simultaneous forming, on the first portions 100a of optoelectronic circuit 100, of a plurality of copies of the second portion 100b of optoelectronic circuit 100, comprising thin-film transistors 110, particularly by the simultaneous carrying out, in a plurality of copies, of the steps previously described in relation with FIGS. 4 and 5;
d) separation of optoelectronic circuits 100, for example, by sawing, each optoelectronic circuit 100 being still attached to handle 164;
e) simultaneous transfer of at least a portion of the optoelectronic circuits 100 of handle 164 onto support 50, particularly by the simultaneous carrying out, for a plurality of optoelectronic circuits, of the steps previously described in relation with FIGS. 8 and 9.

Various embodiments and variants have been described. It will be understood by those skilled in the art that certain characteristics of these various embodiments and variants may be combined, and other variants will occur to those skilled in the art. In particular, the embodiment of FIG. 12 may comprise, as described in relation with FIG. 11, a plurality of stages of thin-film transistors. Further, blocks 122 (respectively 705) and walls 123 (respectively 707) may be formed after the forming of the transistors.

Finally, the practical implementation of the embodiments and variants described herein is within the capabilities of those skilled in the art based on the functional indications provided hereinabove.

The invention claimed is:

1. An optoelectronic device comprising:
   an optoelectronic circuit comprising light-emitting diodes; thin-film transistors, and a stack of electrically-insulating layers, said stack being located between the light-emitting diodes and the transistors, said stack further comprising electrically-conductive elements, between and through said electrically-insulating layers, said electrically-conductive elements connecting at least some of the transistors to the light-emitting diodes; and
   a support having a surface, the support being flexible and/or the surface being curved and non-planar, the optoelectronic circuit being connected to the surface of the support on a thin-film side of the optoelectronic circuit;

wherein the light-emitting diodes comprise wire-shaped, conical, or frustoconical semiconductor elements.

2. The optoelectronic device according to claim 1, wherein the support comprises electrically-conductive tracks, each electrically-conductive track being connected to one of the transistors.

3. The optoelectronic device according to claim 2, further comprising a circuit for controlling the optoelectronic circuit coupled to the electrically-conductive tracks.

4. The optoelectronic device according to claim 1, wherein the total thickness of the optoelectronic circuit is in the range from 0.1 µm to 500 µm.

5. The optoelectronic device according to claim 1, wherein the thickness of the support is in the range from 5 µm to 1,000 µm.

6. The optoelectronic device according to claim 1, wherein the support is at least partly made of polyethylene naphthalate, of polyethylene terephthalate, of polyimide, of cellulose triacetate, of cycloolefin copolymer, of polyetheretherketone, or of a mixture of at least two of these compounds.

7. The optoelectronic device according to claim 1, wherein the transistors are distributed in at least one stage of thin-film transistors.

8. The optoelectronic device according to claim 7, wherein each stage comprises an electrically-insulating layer forming the gate insulator of all the transistors of this stage.

9. The optoelectronic device according to claim 1, wherein, for at least one of the transistors, the source and drain regions and the gate of the transistor are located in a same electrically-insulating layer.

10. The optoelectronic device according to claim 3, wherein the control circuit rests on the support.

11. The optoelectronic device according to claim 1, wherein the optoelectronic circuit has a monolithic structure.

12. The optoelectronic device according to claim 1, comprising a single copy of the optoelectronic circuit.

13. The optoelectronic device according to claim 1, comprising a plurality of copies of the optoelectronic circuit attached to the support and spaced apart from one another.

14. The optoelectronic device according to claim 13, wherein said plurality of copies of the optoelectronic circuit are arranged in rows and in columns, the electrically-conductive tracks extending along the rows and the columns, each electrically-conductive tracks being connected to transistors of a plurality of optoelectronic circuits.

15. A method of manufacturing the optoelectronic device according to claim 1, comprising the forming of an optoelectronic circuit comprising the successive steps of:
 a) forming light-emitting diodes;
 b) forming, on the light-emitting diodes, a stack of electrically-insulating layers, said stack further comprising electrically-conductive elements between and through said electrically-insulating layers; and
 c) forming, on said stack, thin-film transistors, said stack being located between the light-emitting diodes and the transistors, said electrically-conductive elements connecting at least some of the transistors to the light-emitting diodes, the assembly comprising the light-emitting diodes, the stack, and the thin-film transistors forming an optoelectronic circuit.

16. The method of claim 15, further comprising the following step, after step c):
 d) attaching the optoelectronic circuit to the surface of the support, the support being flexible and/or the surface being curved and non-planar.

17. The method according to claim 15, wherein the optoelectronic circuit is formed in a plurality of copies forming a one-piece structure, the method further comprising the following step, after step c):
 e) separation of each copy of the optoelectronic circuit.

18. The method according to claim 15, wherein the total thickness of the optoelectronic circuit is in the range from 0.1 µm to 500 µm.

19. The method according to claim 15, wherein step a) comprises the forming of wire-shaped, conical, or frustoconical semiconductor elements.

20. The method according to claim 19, wherein step a) comprises the forming of electrically-conductive or semiconductor seed pads on a substrate and the growth of the semiconductor elements on the seed pads.

21. The method according to claim 15, wherein steps b) and c) are carried out at temperatures smaller than 180° C.

* * * * *